(12) United States Patent
Thesma Chandran et al.

(10) Patent No.: US 10,818,917 B2
(45) Date of Patent: Oct. 27, 2020

(54) SYSTEMS AND METHODS FOR ELECTRODEPOSITING MANGANESE OXIDE WITH IMPROVED RATE CAPABILITIES FOR ELECTRICAL ENERGY STORAGE

(71) Applicant: THE REGENTS OF THE UNIVERSITY OF CALIFORNIA, Oakland, CA (US)

(72) Inventors: Girija Thesma Chandran, Irvine, CA (US); Reginald M. Penner, Newport Beach, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 219 days.

(21) Appl. No.: 15/934,884

(22) Filed: Mar. 23, 2018

(65) Prior Publication Data
US 2018/0294478 A1    Oct. 11, 2018

Related U.S. Application Data

(60) Provisional application No. 62/475,542, filed on Mar. 23, 2017.

(51) Int. Cl.
| | |
|---|---|
| *H01M 4/36* | (2006.01) |
| *H01G 11/50* | (2013.01) |
| *H01G 11/46* | (2013.01) |
| *H01G 11/24* | (2013.01) |
| *H01M 4/50* | (2010.01) |
| *H01M 4/60* | (2006.01) |

(Continued)

(52) U.S. Cl.
CPC ............ *H01M 4/366* (2013.01); *C25D 1/006* (2013.01); *C25D 1/04* (2013.01); *C25D 3/48* (2013.01); *C25D 5/022* (2013.01); *C25D 5/10* (2013.01); *C25D 7/0607* (2013.01); *C25D 9/02* (2013.01); *C25D 9/04* (2013.01); *C25D 9/08* (2013.01); *G03F 7/70058* (2013.01); *H01G 11/24* (2013.01); *H01G 11/46* (2013.01); *H01G 11/50* (2013.01); *H01G 11/86* (2013.01); *H01M 4/0404* (2013.01); *H01M 4/0452* (2013.01); *H01M 4/13* (2013.01); *H01M 4/139* (2013.01); *H01M 4/364* (2013.01); *H01M 4/502* (2013.01); *H01M 4/60* (2013.01); *H01M 4/75* (2013.01); *H01G 11/56* (2013.01); *H01M 4/661* (2013.01); *H01M 4/667* (2013.01); *H01M 10/0525* (2013.01); *H01M 2300/0085* (2013.01)

(58) Field of Classification Search
None
See application file for complete search history.

(56) References Cited

U.S. PATENT DOCUMENTS

2014/0134503 A1*  5/2014  Lockett .................. H01M 6/40
                                                             429/401

OTHER PUBLICATIONS

Zhu et al., 'Self-branched a-MnO2/d-MnO2 heterojunction nanowires with enhanced pseudocapacitance', Mater. Horiz., 2017, 4, 415, DOI: 10.1039/c6mh00556j (Year: 2017).*

(Continued)

*Primary Examiner* — Ula C Ruddock
*Assistant Examiner* — Anna Korovina
(74) *Attorney, Agent, or Firm* — One LLP

(57) ABSTRACT

Systems and methods that facilitate enhancing the energy storage capabilities of $MnO_2$ in nanowire energy storage devices such as nanowire-based capacitors or batteries.

16 Claims, 13 Drawing Sheets

(51) Int. Cl.
| | |
|---|---|
| H01M 4/75 | (2006.01) |
| C25D 3/48 | (2006.01) |
| C25D 9/02 | (2006.01) |
| C25D 9/08 | (2006.01) |
| C25D 5/02 | (2006.01) |
| C25D 5/10 | (2006.01) |
| C25D 7/06 | (2006.01) |
| G03F 7/20 | (2006.01) |
| H01G 11/86 | (2013.01) |
| C25D 9/04 | (2006.01) |
| C25D 1/04 | (2006.01) |
| C25D 1/00 | (2006.01) |
| H01M 4/13 | (2010.01) |
| H01M 4/04 | (2006.01) |
| H01M 4/139 | (2010.01) |
| H01G 11/56 | (2013.01) |
| H01M 4/66 | (2006.01) |
| H01M 10/0525 | (2010.01) |

(56) References Cited

OTHER PUBLICATIONS

Korotkov et al., "Selective Hydrothermal Microwave Synthesis of Various Manganese Dioxide Polymorphs", Russian Journal of Inorganic Chemistry, vol. 61, No. 2, 2016, DOI: 10.1134/S0036023616020091 (Year: 2016).*

Yin et al., "Preparation of nitrogen-doped titania with high visible light induced photocatalytic activity by mechanochemical reaction of titania and hexannethylenetetrannine", J. Mater. Chem., 2003, 13, 2996-3001, DOI: 10.1039/b309217h (Year: 2003).*

Lee et al., "Hydrothermal preparation of nitrogen-doped graphene sheets via hexamethylenetetramine for application as supercapacitor electrodes", Electrochimica Acta 85 (2012) 459-466, https://doi.org/10.1016/j.electacta.2012.08.070 (Year: 2012).*

Cooney, A. P., et al., "The Acid-Base Behaviour of Hexamine and Its N-Acetyl Derivatives", Journal of the Chemical Society Perkin Transactions 2, 1986, pp. 52-132.

Dementjev, A. P., et al., "X-Ray photoelectron spectroscopy reference data for identification of the $C_3N_4$ phase in carbon-nitrogen films", Diamond and Related Materials, 2000, vol. 9, No. 11, pp. 1904-1907.

Dowding, J. M., et al., "Cellular Interaction and Toxicity Depend on Physicochemical Properties and Surface Modification of Redox-Active Nanomaterials", ACS Nano, 2013, vol. 7, No. 6, pp. 4855-4868.

Duay, J., et al., "Highly flexible pseudocapacitor based on free-standing heterogeneous $MnO_2$ conductive polymer nanowire arrays", Physical Chemistry Chemical Physics, 2012, vol. 14, pp. 3329-3337.

Fan, Z., et al., "Asymmetric Supercapacitors Based on Graphene/$MnO_2$ and Activated Carbon Nanofiber Electrodes with High Power and Energy Density", Advanced Functional Materials, 2011, vol. 21, pp. 2366-2375.

Guen, D., et al., "$MnO_2$ Nanoflake-Shelled Carbon Nanotube Particles for High-Performance Supercapacitors", ACS Sustainable Chemistry & Engineering, 2017, vol. 5, pp. 2445-2453.

He, Y., et al., "Freestanding Three-Dimensional Graphene/$MnO_2$ Composite Networks as Ultralight and Flexible Supercapacitor Electrodes", ACS Nano, 2013, vol. 7, No. 1, pp. 174-182.

Hou, Y., et al., "Design and Synthesis of Hierarchical $MnO_2$ Nanospheres/Carbon Nanotubes/Conducting Polymer Ternary Composite for High Performance Electrochemical Electrode", Nano Letters, 2010, vol. 10, pp. 2727-2733.

Kang, J., et al., "Enhanced Supercapacitor Performance of $MnO_2$ by Atomic Doping", Angewandte Chemie Int Ed, 2013, vol. 52, pp. 1664-1667.

Le, M. L., et al., "In Situ Electrical Conductivity of $Li_xMnO_2$ Nanowires as a Function of x and Size", Chemistry of Materials, 2015, vol. 27, No. 9, pp. 3494-3504.

Lee, J.W., et al., "A Facile and Template-Free Hydrothermal Synthesis of $Mn_3O_4$ Nanorods on Graphene Sheets for Supercapacitor Electrodes with Long Cycle Stability", Chemistry of Materials, 2012, vol. 24, No. 6, pp. 1158-1164.

Li, Q., et al., "Carbon/$MnO_2$ Double-Walled Nanotube Arrays with Fast Ion and Electron Transmission for High-Performance Supercapacitors", ACS Applied Materials & Interfaces, 2014, vol. 6, No. 4, pp. 2726-2733.

Li, W., et al., "$MnO_2$ ultralong nanowires with better electrical conductivity and enhanced supercapacitor performances", Journal of Materials Chemistry, 2012, vol. 22, pp. 14864-14867.

Lin, H., et al, "Conducting polymer composite film incorporated with aligned carbon nanotubes for transparent, flexible and efficient supercapacitor", Scientific Reports, 2013, vol. 3, pp. 1-6.

Liu, W., et al., "High-Performance Microsupercapacitors Based on Two-Dimensional Graphene/Manganese Dioxide/Silver Nanowire Ternary Hybrid Film", ACS Nano, 2015, vol. 9, No. 2, pp. 1528-1542.

Long, J. W., et al., "Three-dimensional battery architectures", Chemical Reviews, 2004, vol. 104, No. 10, pp. 4463-4492.

Menke, E. J., et al al., "Lithographically patterned nanowire electrodeposition", Nature Materials, 2006, vol. 5, pp. 914-919.

Mu, B., et al., "Glycol assisted synthesis of graphene-$MnO_2$-polyaniline ternary composites for high performance supercapacitor electrodes", Physical Chemistry Chemical Physics, 2014, vol. 16, pp. 7872-7880.

Nakayama, M., et al., "A Direct Electrochemical Route to Construct a Polymer/Manganese Oxide Layered Structure", Inorganic Chemistry, 2004, vol. 43, pp. 8215-8217.

Nakayama, M., et al., "Immobilization of Methylviologen between Well-Ordered Multilayers of Manganese Oxide during Their Electrochemical Assembly", Langmuir, 2007, vol. 23, pp. 3462-3465.

Nakayama, M., et al., "Surfactant-Induced Electrodeposition of Layered Manganese Oxide with Large Interlayer Space for Catalytic Oxidation of Phenol", Chemistry of Materials, 2010, vol. 22, pp. 5887-5894.

Rolison, D. R., et al., "Multifunctional 3D nanoarchitectures for energy storage and conversion", Chemical Society Reviews, 2009, vol. 38, pp. 226-252.

Shi, P., et al., "Design of Amorphous Manganese Oxide@Multiwalled Carbon Nanotube Fiber for Robust Solid-State Supercapacitor", ACS Nano, 2017, vol. 11, pp. 444-452.

Thai, M. L., et al., "100k Cycles and Beyond: Extraordinary Cycle Stability for $MnO_2$ Nanowires Imparted by a Gel Electrolyte", ACS Energy Letters, 2016, vol. 1, pp. 57-63.

Thai, M. L., et al., "Collateral Advantages of a Gel Electrolyte for $MnO_2$ Nanowire Capacitors: Higher Voltage and Reduced Volume", ACS Energy Letters, 2017, vol. 2, No. 5, pp. 1162-1169.

Wei, W., et al., "Manganese oxide-based materials as electrochemical supercapacitor electrodes", Chemical Society Reviews, 2011, vol. 40, pp. 1697-1721.

Wu, Z. S., et al., "High-Energy $MnO_2$ Nanowire/Graphene and Graphene Asymmetric Electrochemical Capacitors", ACS Nano, 2010, vol. 4, No. 10, pp. 5835-5842.

Xiang, C., et al., "Lithographically Patterned Nanowire Electrodeposition: A Method for Patterning Electrically Continuous Metal Nanowires on Dielectrics", ACS Nano, 2008, vol. 2, No. 9, pp. 1939-1949.

Xiang, C., et al., "Cheating the diffraction limit: electrodeposited nanowires patterned by photolithography", Chemical Communications, 2009, pp. 859-873.

Yan, J., et al., "Fast and reversible surface redox reaction of graphene—$MnO_2$ composites as supercapacitor electrodes", Carbon, 2010, vol. 48, No. 13, pp. 3825-3833.

Yan, W., et al., "Lithographically Patterned Gold/Manganese Dioxide Core/Shell Nanowires for High Capacity, High Rate, and High Cyclability Hybrid Electrical Energy Storage", Chemistry of Materials, 2012, vol. 24, No. 12, pp. 2382-2390.

Yan, W., et al., "A Lithographically Patterned Capacitor with Horizontal Nanowires of Length 2.5 mm", ACS Applied Materials & Interfaces, 2014, vol. 6, No. 7, pp. 5018-5025.

(56) References Cited

OTHER PUBLICATIONS

Yang, P. et al., "Flexible solid-state electrochemical supercapacitors", Nano Energy, 2014, vol. 8, pp. 274-290.
Yang, S.Y., et al., "Design and tailoring of a hierarchical graphene-carbon nanotube architecture for supercapacitors", Journal of Materials Chemistry, 2011, vol. 21, pp. 2374-2380.
Zhang, Y., et al., "Progress of electrochemical capacitor electrode materials: A review", International Journal of Hydrogen Energy, 2009, vol. 34, No. 11, pp. 4889-4899.

\* cited by examiner

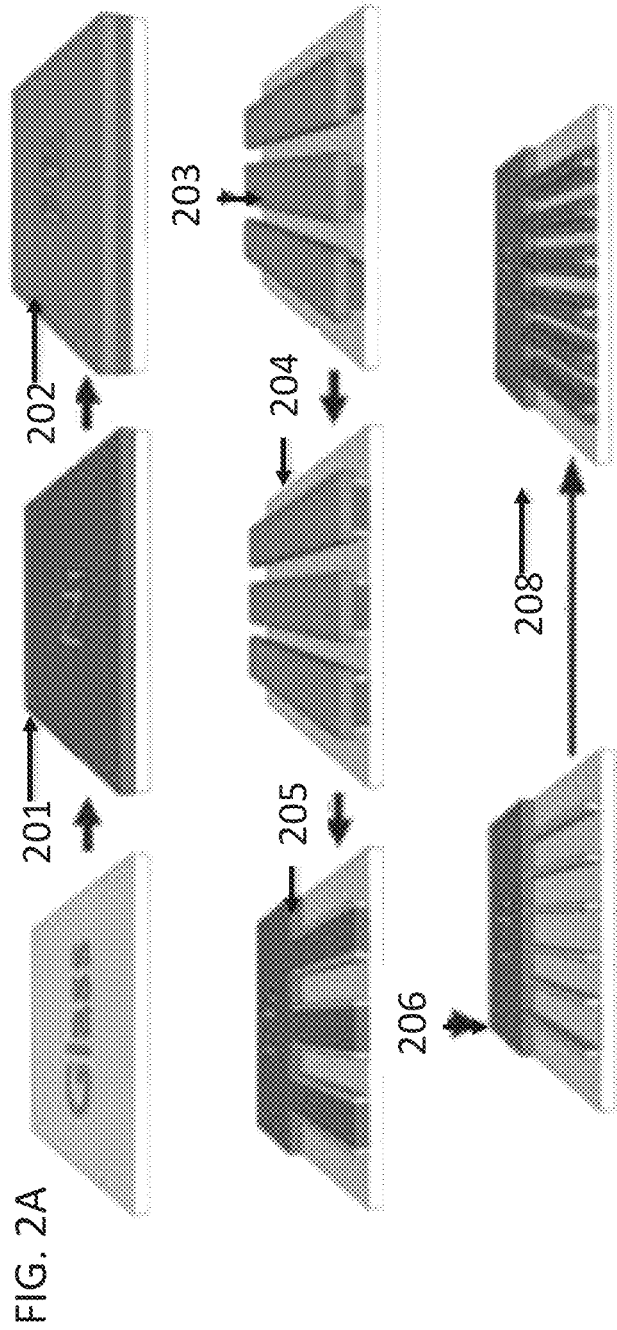
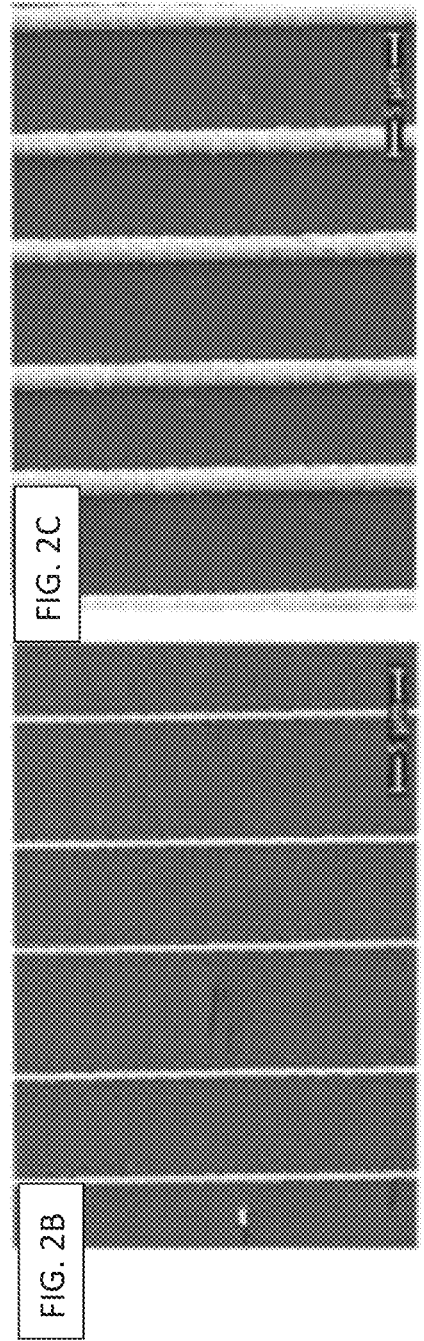
FIG. 2A
FIG. 2B
FIG. 2C

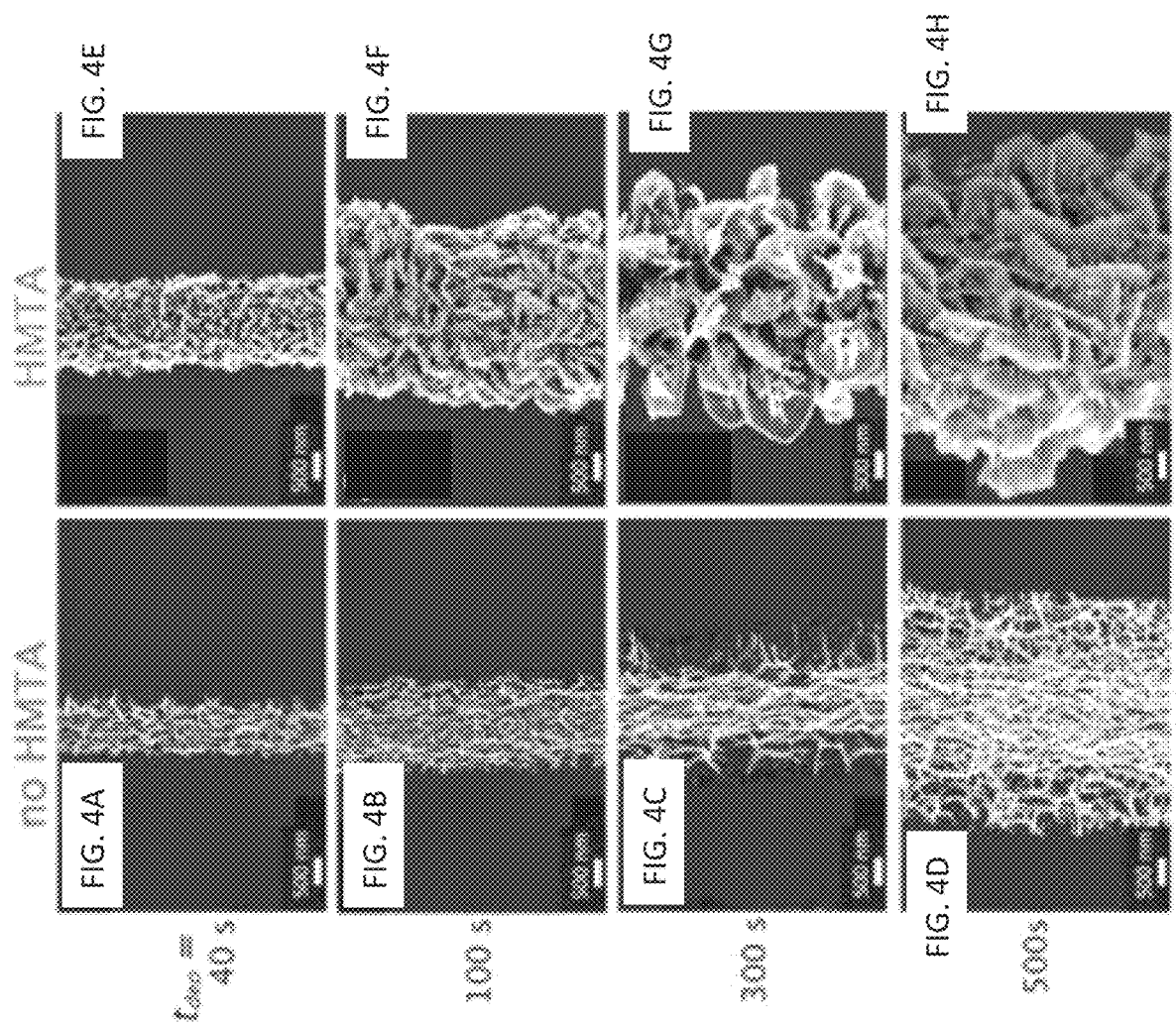

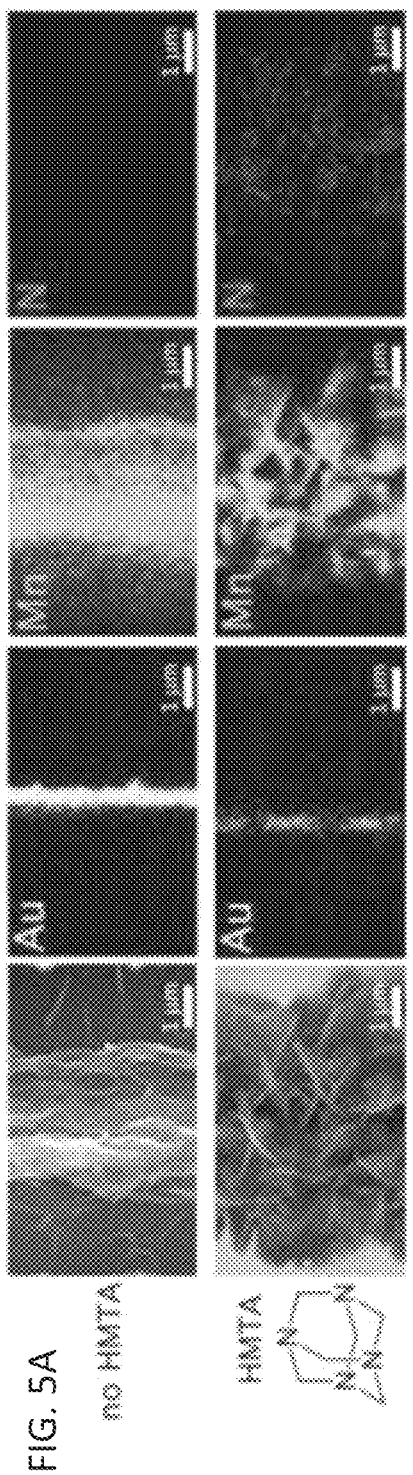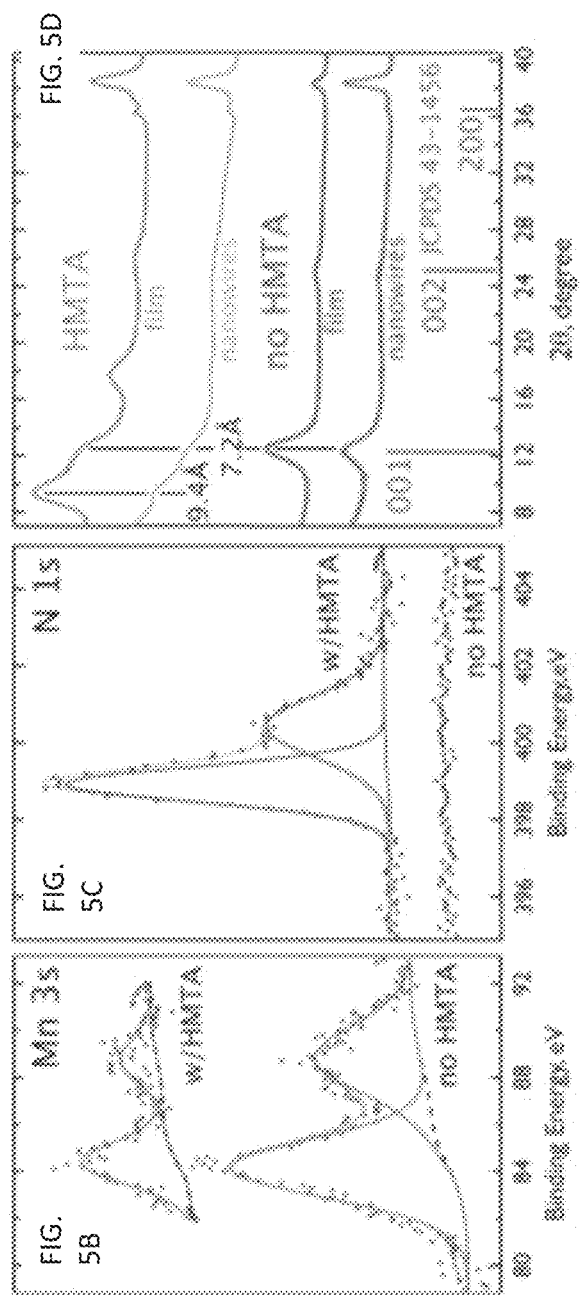

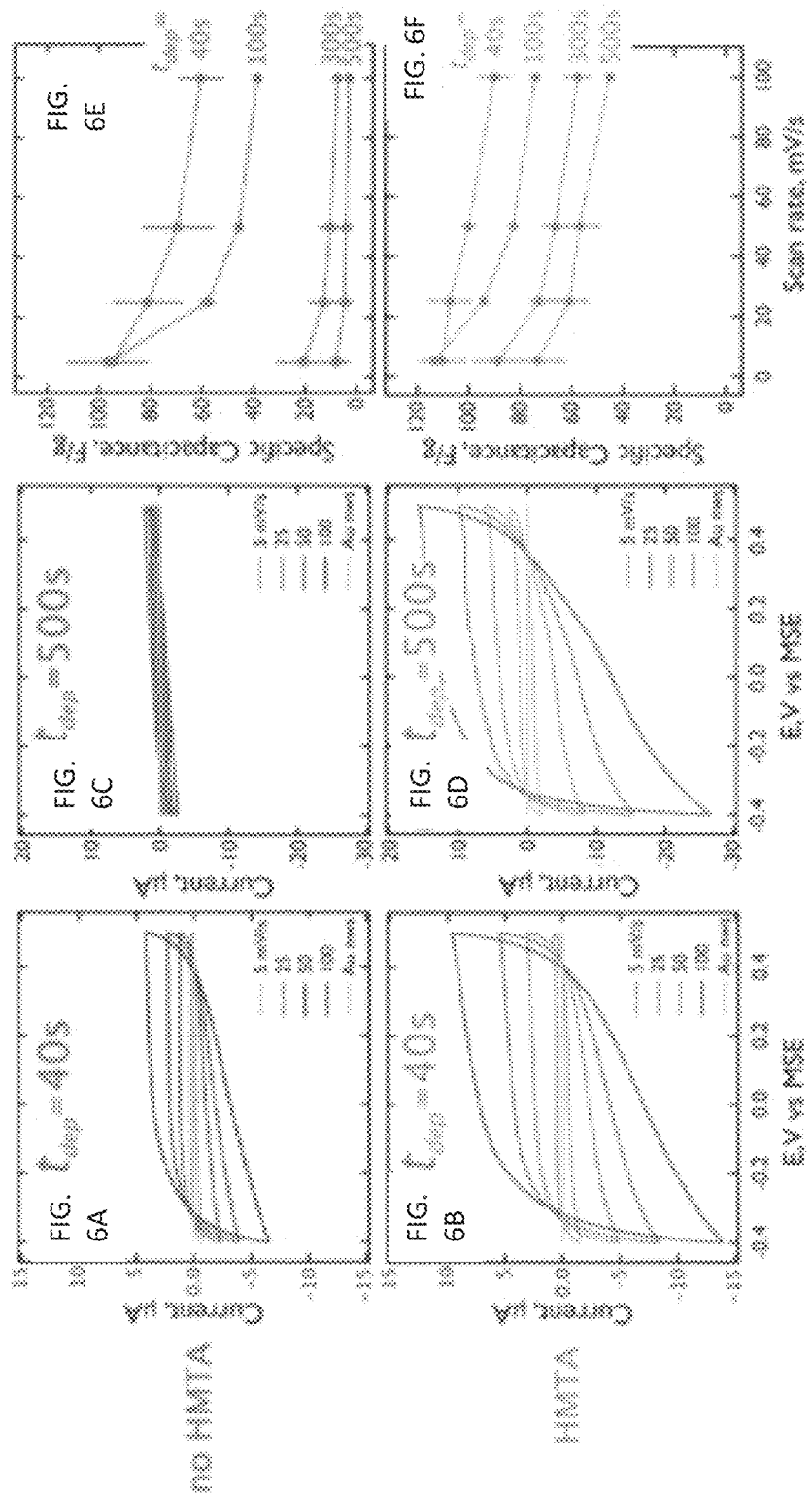

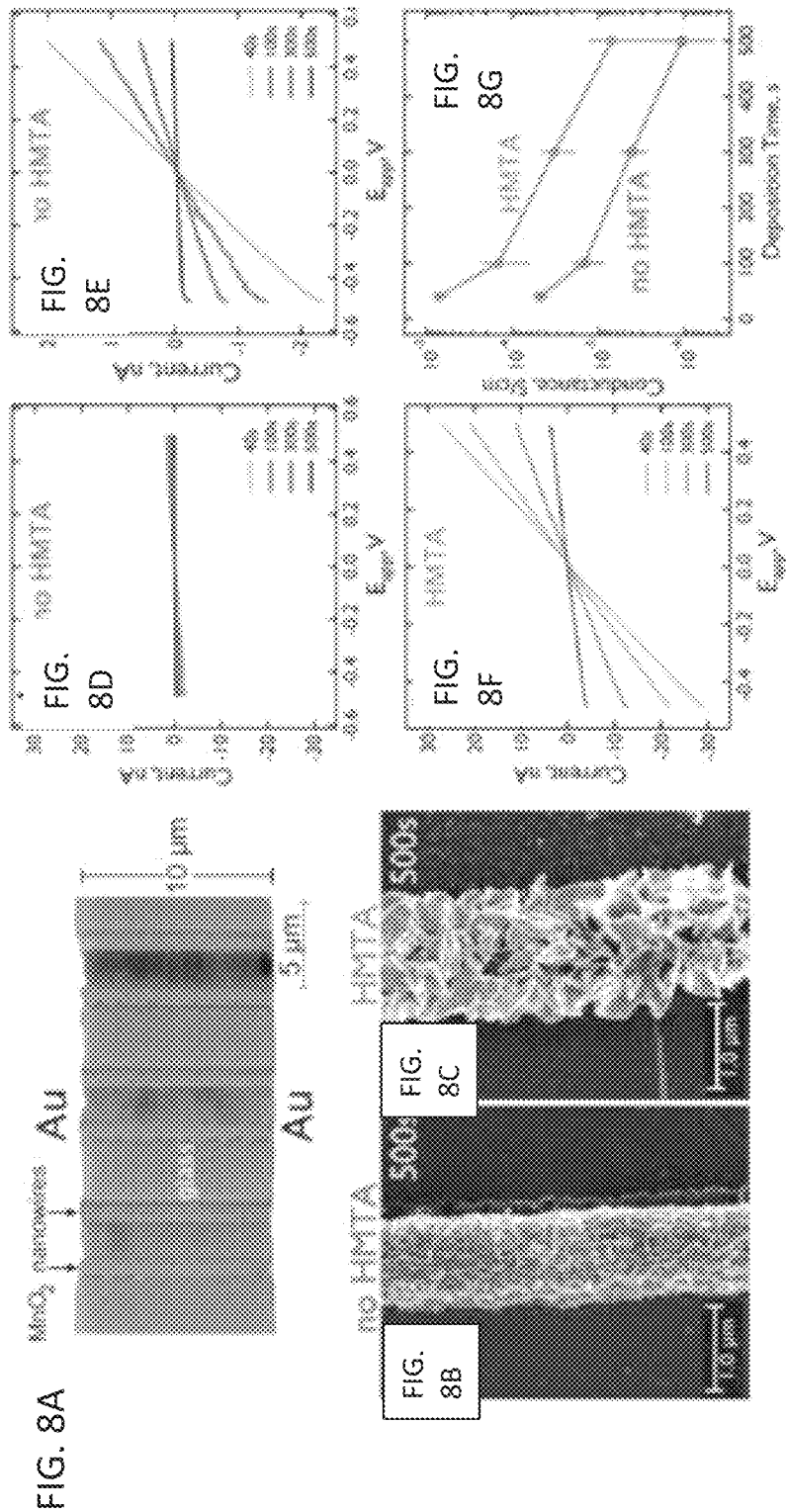

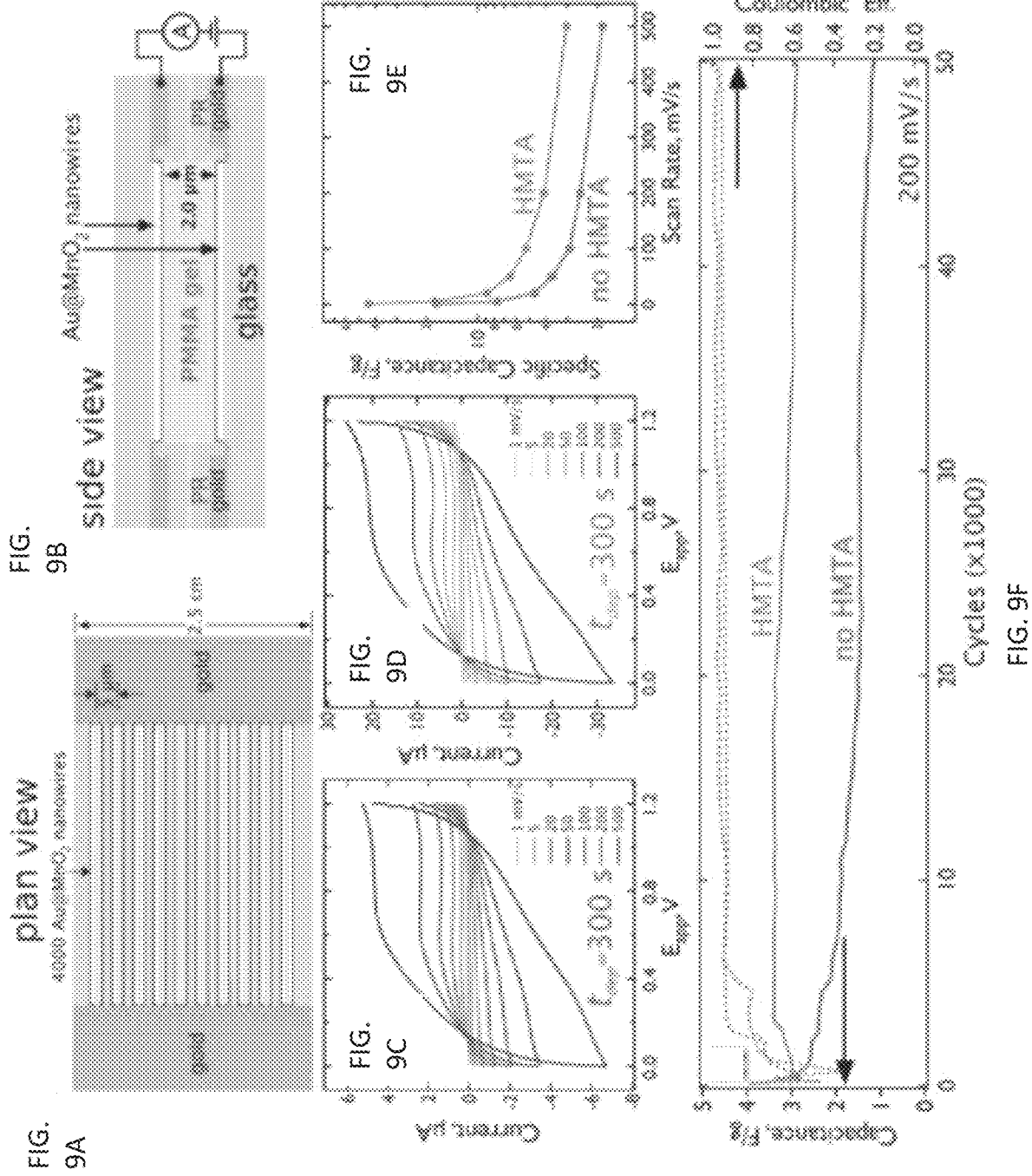

From FIG. 10A
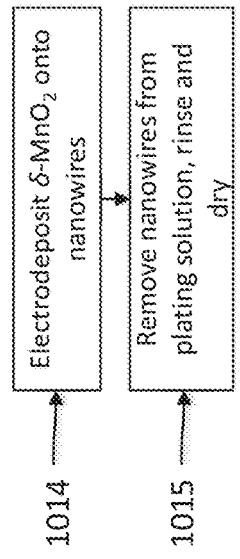
1014 Electrodeposit δ-MnO₂ onto nanowires
1015 Remove nanowires from plating solution, rinse and dry
HMTA-free
FIG. 10C

SYSTEMS AND METHODS FOR ELECTRODEPOSITING MANGANESE OXIDE WITH IMPROVED RATE CAPABILITIES FOR ELECTRICAL ENERGY STORAGE

CROSS REFERENCE TO RELATED APPLICATIONS

The present application claims priority to U.S. Provisional Application Ser. No. 62/475,542, titled "SUPERCHARGING A $MnO_2$ NANOWIRE: AN AMINE-ALTERED MORPHOLOGY RETAINS CAPACITY AT HIGH RATES AND MASS LOADINGS," filed Mar. 23, 2017, the contents of which are incorporated herein by reference in their entirety.

This invention was made with Government support under Grant No. DESC0001160, awarded by the Department of Energy. The Government has certain rights in this invention.

FIELD

The subject matter described herein relates generally to energy storage devices and, more particularly, to systems and methods for enhancing the energy storage capabilities of an important $Li\pm$ insertion metal oxide, Manganese Oxide ($MnO_2$). The process enables $MnO_2$ to function at a higher rate, and for thicker coatings, enhancing the energy and power of batteries or capacitors.

BACKGROUND

Manganese oxide ($Li_xMnO_2$) is a Li+ insertion metal oxide with a high theoretical Faradaic charge storage capacity, $C_{sp}$ of 1110 F/g (assuming a 1.0 V window), powered by Mn centers that can toggle between +2 or +3 oxidation states. This Faradaic $C_{sp}$ is higher than for many insertion oxides including $SnO_2$ (640 F/g), $RuO_2$ (725 F/g), $Nb_2O_5$ (726 F/g), and is comparable to $Fe_2O_3$ (1249 F/g) and $Co_3O_4$ (1206 F/g). $C_{sp}$ values >1000 F/g are indeed measured experimentally in $Li_xMnO_2$ half-cells and equivalent values of $C_{sp}$ are seen in symmetrical $Li_xMnO_2$ capacitors, but only for very slow charge/discharge rates in the 1-2 mV/s range and for very thin $MnO_2$ layers, with thicknesses <80 nm. At higher rates, $C_{sp}$ is rapidly reduced by a factor of 10-50 at 100 mV/s, for example. $C_{sp}$ is also depressed as the mass loading of $MnO_2$ on a current collector, and the shell thickness, increases. Thus, the tremendous potential of $Li_x$-$MnO_2$ for energy storage in either capacitors or batteries is limited by poor rate performance, especially at significant mass loadings. These related phenomena are poorly understood at present.

The well-known limitations of $MnO_2$ have stimulated interest in improving it, as already indicated. Hundreds of papers already describe the mitigation of the low electronic conductivity of $MnO_2$ by the preparation of composites of $MnO_2$ with graphene, carbon nanotubes, conductive polymers, and other electrically conductive materials. In addition to the preparation of composites, there is some work aimed at altering the properties of the $MnO_2$ itself with gold evaporated into $MnO_2$ films, thereby increasing the half-cell $C_{sp}$ by a factor of two at 100 mV/s. This increase was attributed to the increased electrical conductivity of the $MnO_2/Au$ composite. The $MnO_2$ morphology has been altered by hydrothermal synthesis in the presence of a surfactant, poly(vinylpyrrolidone) (PVP). Single 40-50 nm diameter nanowires of $MnO_2$ with micron-scale lengths prepared by this technique showed a higher $C_{sp}$ as compared with larger nanorods. Nakayama and coworkers prepared electrodeposited birnessite $MnO_2$ incorporating a variety of dopants including poly(diallyldimethyl-ammonium) cations, methyl viologen, and long chain, n-alkyl ammonium cations. The d-spacing of the birnessite was adjusted over several nanometers by these dopant species, and applications of these composite materials to the catalysis of the oxygen evolution reaction were explored.

Therefore, it is desirable to provide systems and methods that facilitates enhancing the energy storage capabilities of $MnO_2$.

BRIEF DESCRIPTION OF THE DRAWINGS

The details of the example embodiments, including structure and operation, may be gleaned in part by study of the accompanying figures, in which like reference numerals refer to like parts. The components in the figures are not necessarily to scale, emphasis instead being placed upon illustrating the principles of the invention. Moreover, all illustrations are intended to convey concepts, where relative sizes, shapes and other detailed attributes may be illustrated schematically rather than literally or precisely.

FIG. 2A illustrates an exemplary preparation process flow using lithographically patterned nanowire electrodeposition of Au@δ-$MnO_2$ nanowires, according to embodiments.

FIG. 2B illustrates an SEM image of five gold nanowires prepared according to steps 201-206 of the process of FIG. 2A.

FIG. 2C illustrates an SEM image of six gold nanowires prepared by the electrodeposition of δ-$MnO_2$ onto gold nanowires (step 207 of the exemplary process of FIG. 2A).

FIG. 4A illustrates an exemplary SEM image of Au@δ-$MnO_2$ core@shell nanowires where the $MnO_2$ shell was prepared in the absence of HTMA.

FIG. 4B illustrates an exemplary SEM image of Au@δ-$MnO_2$ core@shell nanowires where the $MnO_2$ shell was prepared in the absence of HTMA.

FIG. 4C illustrates an exemplary SEM image of Au@δ-$MnO_2$ core@shell nanowires where the $MnO_2$ shell was prepared in the absence of HTMA.

FIG. 4D illustrates an exemplary SEM image of Au@δ-$MnO_2$ core@shell nanowires where the $MnO_2$ shell was prepared in the absence of HTMA.

FIG. 4E illustrates an exemplary SEM image of Au@δ-$MnO_2$ core@shell nanowires where the $MnO_2$ shell was prepared in the presence of HTMA.

FIG. 4F illustrates an exemplary SEM image of Au@δ-$MnO_2$ core@shell nanowires where the $MnO_2$ shell was prepared in the presence of HTMA.

FIG. 4G illustrates an exemplary SEM image of Au@δ-$MnO_2$ core@shell nanowires where the $MnO_2$ shell was prepared in the presence of HTMA.

FIG. 4H illustrates an exemplary SEM image of Au@δ-MnO$_2$ core@shell nanowires where the MnO$_2$ shell was prepared in the presence of HTMA.

FIG. 4I illustrates an exemplary plot of thickness of the MnO$_2$ outer shell envelope as a function of $t_{dep}$, based on the width of the Au@δ-MnO$_2$ nanowires in plan-view SEM images like those shown in FIGS. 4A-4H.

FIG. 5A illustrates exemplary characterization of Au@δ-MnO$_2$ nanowires.

FIG. 5B illustrates XPS spectra of δ-MnO$_2$ films show high resolution scans in the Mn 3 s region.

FIG. 5C illustrates XPS spectra of δ-MnO$_2$ films show high resolution scans in the N 1 s region.

FIG. 5D illustrates exemplary characterization of Au@δ-MnO$_2$ nanowires.

FIG. 6A illustrates Cyclic voltammetry of no-HMTA Au/MnO$_2$ core:shell nanowire arrays.

FIG. 6B illustrates Cyclic voltammetry of HMTA Au/MnO$_2$ core:shell nanowire arrays.

FIG. 6C illustrates Cyclic voltammetry of no-HMTA Au/MnO$_2$ core:shell nanowire arrays.

FIG. 6D illustrates Cyclic voltammetry of HMTA Au/MnO$_2$ core:shell nanowire arrays.

FIG. 6E illustrates $C_{sp}$ versus scan rate for no-HMTA Au/MnO$_2$ core:shell nanowire arrays.

FIG. 6F illustrates $C_{sp}$ versus scan rate for HMTA Au/MnO$_2$ core:shell nanowire arrays.

FIG. 8A illustrates an SEM image of six MnO$_2$ nanowires on glass.

FIG. 8B illustrates higher magnification (compared to FIG. 8A) of SEM image of no-HMTA MnO$_2$ nanowires deposited for 500 s.

FIG. 8C illustrates higher magnification (compared to FIG. 8A) of SEM image of HMTA MnO$_2$ nanowires deposited for 500 s.

FIG. 8D illustrates current versus voltage for a no-HMTA nanowire array.

FIG. 8E illustrates current versus voltage for a no-HMTA nanowire array.

FIG. 8F illustrates current versus voltage for a HMTA nanowire array at the same current sensitivity shown in FIG. 8D.

FIG. 8G illustrates electrical conductance versus electrodeposition time for four deposition times for HMTA MnO$_2$ nanowires and no-HMTA MnO$_2$ nanowires.

FIG. 9A illustrates a schematic diagram of an exemplary sandwich capacitor architecture.

FIG. 9B illustrates a schematic diagram of a side view of an exemplary sandwich capacitor architecture.

FIG. 9C illustrates Cyclic voltammograms as a function of scan rate for no-HMTA capacitors prepared using $t_{dep}$=300 s.

FIG. 9D illustrates Cyclic voltammograms as a function of scan rate for HMTA capacitors prepared using $t_{dep}$=300 s.

FIG. 9E illustrates $C_{sp}$ versus scan rate for both capacitors of FIGS. 9C and 9D.

FIG. 9F illustrates $C_{sp}$ (left axis) and coulombic efficiency (right axis), measured at 200 mV/s, as a function of number of scans.

FIGS. 10A-C illustrate an exemplary fabrication process flow for use with embodiments of the present disclosure.

It should be noted that elements of similar structures or functions are generally represented by like reference numerals for illustrative purpose throughout the figures. It should also be noted that the figures are only intended to facilitate the description of the preferred embodiments.

OVERVIEW

Figure 1:
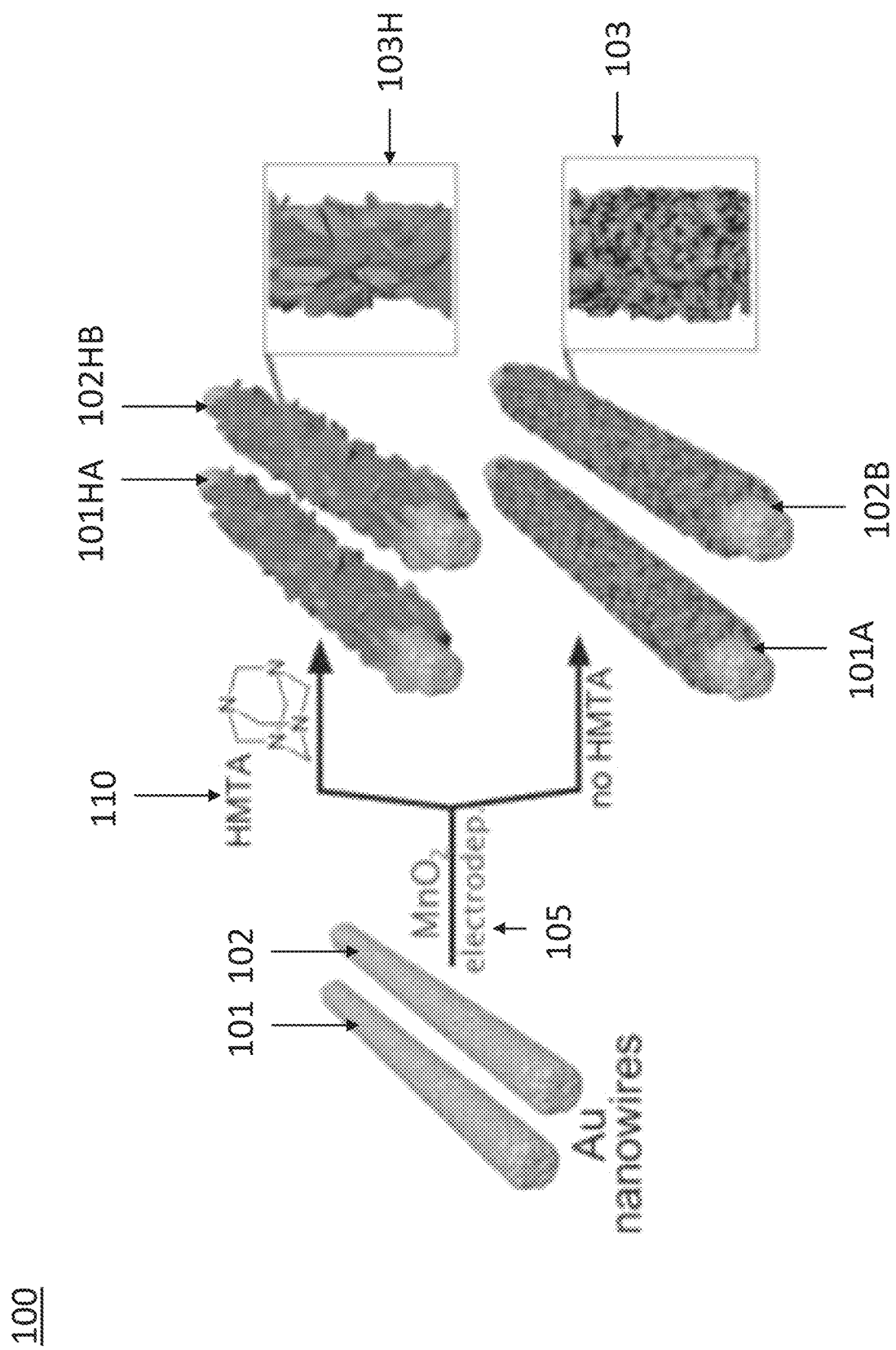
FIG. 1 is a schematic representation of the influence of HMTA on the morphology of Au@δ-$MnO_2$ nanowires prepared by electrodeposition, according to embodiments.

The various embodiments provided herein are generally directed to systems and methods that facilitate enhancing the energy storage capabilities of MnO$_2$ in nanowire energy storage devices such as nanowire-based capacitors or batteries. According to embodiments, a method for preparing arrays of δ-MnO$_2$ based core@shell nanowires comprises electrodepositing a core metal to form an array of nanowire cores and electrodepositing HMTA-doped δ-MnO$_2$ onto the array of nanowire cores to produce an array of core metal@δ-MnO$_2$, core@shell nanowires.

In some embodiments, the core metal comprises Au. In some embodiments, the array of nanowire cores is formed on a glass substrate.

According to embodiments, a method for preparing arrays of δ-MnO$_2$ based nanowires comprises depositing a photoresist layer onto a substrate, patterning the photoresist layer, and electrodepositing HMTA-doped δ-MnO$_2$ onto the patterned photoresist layer to produce an array of δ-MnO$_2$ based nanowires.

In some embodiments, the substrate comprises soda lime glass. In some embodiments, the photoresist layer is deposited by spin coating. In some embodiments, the photoresist layer is patterned using a 36 nm UV light source combined with a shutter and photolithographic alignment fixture. In some embodiments, the photoresist layer is developed for 20 s. In some embodiments, the photoresist layer is rinsed using Millipore water.

In some embodiments, electrodepositing HMTA-doped δ-MnO$_2$ onto the patterned photoresist layer comprises electrodepositing an HMTA-free primer layer onto the patterned photoresist layer to create an array of MnO$_2$ primed gold nanowires, and electrodepositing HMTA-doped δ-MnO$_2$ onto the array of MnO$_2$ primed gold nanowires to produce the array of δ-MnO$_2$ based nanowires.

In some embodiments, an energy storage device comprises first and second contacts, and an array of nanowires extending between the first and second contacts. In some embodiments, individual nanowires of the array of nanowires include HMTA-doped δ-MnO$_2$.

In some embodiments, the HMTA-doped δ-MnO$_2$ has a coating characterized by petals with a thickness of 6 nm to 9 nm.

In some embodiments, the HMTA-doped δ-MnO$_2$ includes interlayer spacing that is expanded by 30% compared to non-HMTA-doped δ-MnO$_2$.

In some embodiments, $C_{sp}$ for the HMTA-doped δ-MnO$_2$ with $t_{dep}$=500 s is at least 15× higher at 200 mV/s than non-HMTA-doped δ-MnO$_2$.

DESCRIPTION

The various embodiments provided herein are generally directed to systems and methods that facilitate enhancing the energy storage capabilities of MnO$_2$ in nanowire energy storage devices such as nanowire-based capacitors or batteries.

Barriers to Li+ intercalation/deintercalation at the MnO$_2$-electrolyte interface and slow Li diffusion within the MnO$_2$ are two contributing factors that have been proposed as potential sources of the aforementioned poor rate of performance. The influence of both of these mechanisms is minimized by increasing the level of dispersion of the MnO$_2$ by, for example, decreasing the $MnO_2$ particle diameter. Increased dispersion translates into a higher surface area: volume ratio and reduced diffusion path lengths within the $MnO_2$ for Li. A significant disadvantage of $Li_xMnO_2$—again shared by other metal oxides—is its low electronic conductivity which varies from $2-4\times10^{-4}$ S/cm (x=0) increasing to $4-5\times10^{-2}$ S/cm (for x=1.0) as compared with $\approx 10^5$ S/cm for a metal such as silver. The low conductivity of $Li_xMnO_2$ necessitates that it be supported at high dispersion on a good conductor such as a metal or carbon, and many examples of this general paradigm have been reported (e.g., an approach disclosed by the inventors has been to embed a gold nanowire within a shell of $\delta$-$MnO_2$—so-called Au@$MnO_2$ core:shell nanowires—where both the gold nanowires and the $\delta$-$MnO_2$ shell are prepared by electrodeposition). A key point is that the gold nanowire core does not insure facile electrical communication with the $MnO_2$ shell when this shell increases in thickness beyond 60 nm or so. In Au@$MnO_2$ nanowires, the $MnO_2$ shell must still intercalate Li+ and communicate electrically with the gold nanowire core, and the strategy outlined according to the embodiments disclosed herein is intended to impact one or both of these processes.

In certain embodiments, planar arrays of gold@$\delta$-$MnO_2$, core@shell nanowires, are prepared by electrodeposition with hexamethylenetetramine (hereinafter referred to as "HMTA") and their electrochemical properties evaluated. HMTA alters the $MnO_2$ in three ways: First, it changes the morphology of the $MnO_2$ creating a more open morphology for the $MnO_2$ coating, characterized by "petals" with a thickness of 6 nm to 9 nm, rather than much thinner $\delta$-$MnO_2$ sheets seen in the absence of HMTA. Second, the electronic conductivity of the $\delta$-$MnO_2$ is increased by an order of magnitude. Third, $\delta$-$MnO_2$ prepared in HMTA show a (001) interlayer spacing that is expanded by ~30% possibly accelerating Li transport. The net effect of "HMTA-doping" is to dramatically improve high rate performance. The net result are Au@$\delta$-$MnO_2$ nanowires that better retain $C_{sp}$ at high charge/discharge rates, and/or at high $MnO_2$ mass loadings. This is a large effect: $C_{sp}$ for the thickest $\delta$-$MnO_2$ shells, with $t_{dep}$=500 s, were a factor of 15 times higher at 200 mV/s when HMTA was present in the plating solution.

FIG. 1 is a schematic representation of the influence of HMTA on the morphology of Au@$\delta$-$MnO_2$ nanowires prepared by electrodeposition, according to embodiments. In FIG. 1, an exemplary process 100 for altering the morphology of the electrodeposited $MnO_2$ shell using an amine dopant, hexamethylenetetramine (HMTA) 110 is illustrated. Attention is focused on the properties of Au@$\delta$-$MnO_2$ nanowires 101, 102 with thick $MnO_2$ shells ($d_{MnO2}$=400 nm to 2.2 μm) obtained using high $MnO_2$ 105 mass loadings onto the gold nanowire. These nanowires 101, 102 exhibit a dramatic loss of $C_{sp}$ (>95%) at high potential scan rates of 100 mV/s. A more open morphology for the $\delta$-$MnO_2$ is obtained in the presence of HMTA (101HA, 101HB), in addition to two other observed changes: 1) the electronic conductivity of the $\delta$-$MnO_2$ is increased by an order of magnitude, and, 2) new reflections in the XRD pattern (103H, 103) reveal the (001) layer spacing increases significantly, possibly facilitating Li intercalation/deintercalation and transport. HMTA Au@ $\delta$-$MnO_2$, core@shell nanowires (101HA, 101HB) show dramatically improved rate performance (compared to no-HMTA Au@ $\delta$-$MnO_2$, core@shell nanowires (101A, 101B), characterized by an increase in $C_{sp}$ of 15× at 100 mV/s for the thickest $MnO_2$ shells studied.

Preparation of Au/$MnO_2$ Core:Shell Nanowires.

FIG. 2A illustrates an exemplary preparation process flow using lithographically patterned nanowire electrodeposition of Au@$\delta$-$MnO_2$ nanowires, according to embodiments.

Process flow 200 provides for fabricating Au@$MnO_2$ core:shell nanowires. A 40 nm thick nickel film is thermally evaporated on top of precleaned 1"×1" squares of soda lime glass (step 201). Then a positive photoresist (PR, Shipley, 51808) layer is deposited by spin-coating (step 202), followed by soft-baking at 90° C. for 30 min, and a contact mask is used to pattern the PR layer with a 365 nm UV light source combined with a shutter and photolithographic alignment fixture (Newport, 83210i-line, 2.3 s). The exposed PR region is developed for 20 s (Shipley, MF-319) and then rinsed with Millipore water (Milli-Q, p >18 MΩ·cm). The exposed nickel removed by etching for 6 min in 0.8 M nitric acid (step 203). The whole device is then dipped into commercial Au plating solution (Clean Earth Solutions) and Au is potentiostatically electrodeposited using a Gamry Series G 300 potentiostat at −0.9 V versus saturated calomel electrode (SCE) using a one-compartment, three-electrode electrochemical cell with a Pt foil counter electrode (step 204). After electrodeposition, the surface is first rinsed with acetone to remove photoresist, and then with Millipore water, revealing patterned Ni pads together with Au nanowires deposited on the edges of these pads (step 205). Nickel is then removed by immersion in nitric acid for 6 min (step 206). After etching, the device is rinsed with Millipore water and air-dried. On the unetched side of this nanowire array, the Au nanowires still attached to nickel fingers are used as electrical contacts. This completes the exemplary preparation by LPNE of a gold nanowire array.

Finally, $\delta$-$MnO_2$ is electrodeposited onto these nanowires (step 207) using either of two procedures: HMTA-free Au/$MnO_2$ nanowires are prepared using an aqueous solution of 2 mM $Mn(ClO_4)_2$ and 50 mM $LiClO_4$ by potentiostatic oxidation at +0.60 V vs. MSE. Deposition times ranging from 40 s to 500 s produced $MnO_2$ shells between 400 nm and 2.2 μm in thickness. Au/$MnO_2$ core:shell nanowires containing HMTA are prepared using a two step procedure in which a thin HMTA-free "primer" layer is first electrodeposited as described above, using a $t_{dep}$+10 s. Then, HMTA-doped $\delta$-$MnO_2$ is electrodeposited onto $MnO_2$-primed gold nanowires from a solution containing 10 mM HMTA in addition to 2 nM $Mn(ClO_4)_2$ and 50 mM $LiClO_4$. A $t_{dep}$ ranging from 30 s to 490 s results in the unique $MnO_2$ morphology described below. In both cases, freshly deposited Au@$MnO_2$ nanowires are removed from plating solutions, rinsed with Millipore water, and dried in the oven at 90° C. for 30 min prior to electrochemical assessment.

All three-electrode, half-cell measurements were performed on arrays of 1800 nanowires. All capacitor measurements involved a sandwich of two 1800 nanowire layers.

FIG. 2B illustrates an SEM image of five gold nanowires prepared according to steps 201-206 of the process of FIG. 2A.

FIG. 2C illustrates an SEM image of six gold nanowires prepared by the electrodeposition of $\delta$-$MnO_2$ onto gold nanowires (step 207 of the exemplary process of FIG. 2A).

Preparation of $\delta$-$MnO_2$ Nanowire for Conductivity Measurements.

"Solid" $\delta$-$MnO_2$ nanowires, prepared without a Au core nanowire, were synthesized for conductivity measurements. These $\delta$-$MnO_2$ nanowires were prepared following the lithographically patterned nanowire electrodeposition (LPNE)

method discussed in a previous work. Although in this work electrodeposition of MnO$_2$ was carried out at a constant potential of +0.6 Vvs MSE for 40 s, 100 s, 300 s, and 500 s using two different plating solutions, one with HMTA and one without HMTA, as discussed above.

Preparation of the Gel Electrolyte and Sandwich Capacitor Assembly.

Symmetrical, Au@δ-MnO$_2$ nanowire "sandwich" capacitors were prepared by fabricating 1800 nanowire arrays on each of two glass substrates, and pressing these two layers together, using a ≈2 μm thick PMMA gel electrolyte. The 1.0 M LiClO$_4$, 20 w/w %, PMMA, PC gel electrolyte was prepared by adding 1.6 g (20 w/w %) of PMMA to 5 mL of 1.0 M LiClO$_4$ in dry propylene carbonate (PC) with mixing at 115° C. In a desiccator, the mixed gel was permitted to cool to room temperature as it transformed to the gel state. The 1.0 M LiClO$_4$, 20 w/w %, PMMA, PC gel electrolyte was deposited on the device by spin-coating (2500 rpm, 160 s) resulting in a layer of ≈1 μm thickness. Two of these devices were combined to form a complete sandwich capacitor with a total PMMA gel layer thickness of ≈2 μm. This assembly was accomplished by pressing together these nanowire layers with the electrical contacts oriented on opposite ends of the device. After assembly, sandwich capacitors were hermetically sealed to exclude moisture using hot glue prior to electrochemical characterization.

Structural Characterization.

Scanning electron micrographs were acquired using a FEI Magellan 400 XHR system. Energy dispersive spectroscopic (EDS) images were acquired by the same SEM system with EDS detector (Oxford Instruments, 80 mm$^2$, with Aztec software). Accelerating voltages of incident electron beams ranged from 1 kV to 25 kV, and probe currents ranged from 13 pA to 0.8 nA. All SEM specimens were mounted on stainless stubs and held by carbon tape. Grazing-incidence X-ray diffraction (GIXRD) patterns were obtained using a Rigaku SmartLab x-ray diffractometer employing the parallel beam optics. The x-ray generator was operated at 40 kV and 44 mA with Cu Kα irradiation. X-ray photoelectron spectroscopy (XPS) was measured using the AXIS Supra by Kratos Analytical Inc. equipped with monochromatic Al/Ag X-ray source.

Electrochemical Characterization.

All electrochemical measurements were performed in a one-compartment three-electrode cell using a Gamry potentiostat. The specific capacitance, $C_{sp}$, was measured in 1.0 M LiClO$_4$ in dry acetonitrile. Prior to each measurement, the acetonitrile was presaturated with N$_2$ gas. A Pt foil was used as a counter electrode in conduction with a saturated mercurous sulfate reference electrode (MSE). All potentials are quoted with respect to the saturated mercurous sulfate reference electrode (MSA), EMSE=+0.640 Vversus normal hydrogen electrode. A value of 0.78 μg/mC was used to determine MnO$_2$ shell masses from the deposition charge as required for the calculation of $C_{sp}$.

Electrodeposition of δ-MnO$_2$ from HMTA-Containing and HMTA-Free Plating Solutions.

Linear arrays of 1800 gold nanowires with lateral dimensions of 275 nm (w)×40 nm (h) were prepared on glass surfaces using the LPNE process (FIG. 2A). Gold nanowires were more than 1.0 cm in length, and were prepared with a wire-to-wire pitch of 5 μm (FIG. 2B).

Au@δ-MnO$_2$ core@shell nanowires were obtained by exposing a 0.90 cm length of this array to a MnO$_2$ plating solution. δ-MnO$_2$ was electrodeposited in a hemicylindrical layer onto each of the gold nanowires in the array (FIG. 2C). The same potentiostatic oxidation procedure was used for HMTA-containing plating solutions and HMTA-free solutions. This involved the electrochemical oxidation of Mn$_2$+ at +0.60 V vs. MSE:

$$Mn_2^+ + 2H_2O \rightarrow MnO_2 + 4H^+ + 2e^- \qquad (1)$$

Figure 3A:
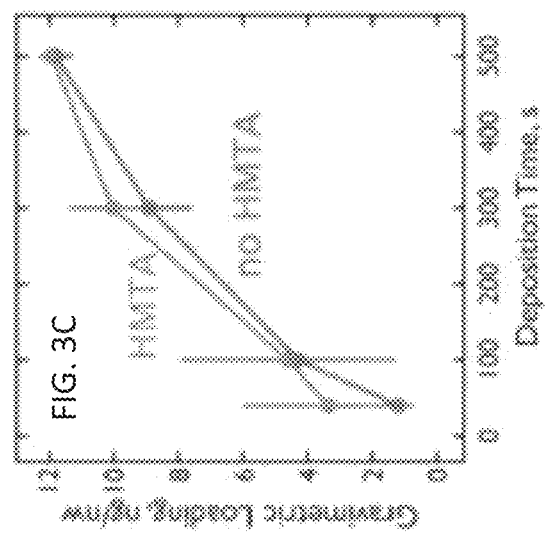
FIG. 3A illustrates an exemplary current versus time trace of potentiostatic growth of δ-$MnO_2$ at +0.60V versus MSE in solutions containing no-HMTA.
Figure 3B:
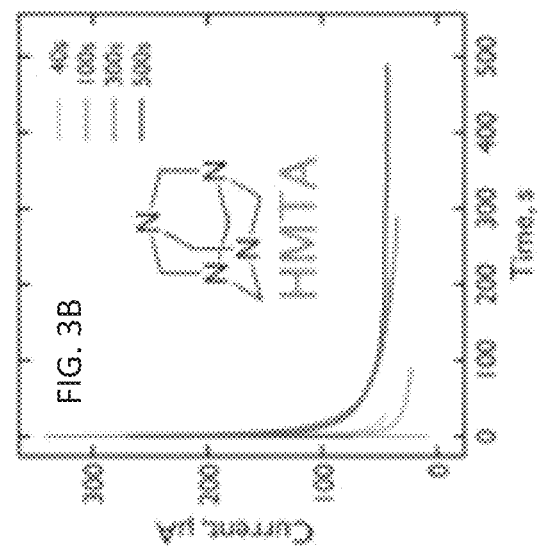
FIG. 3B illustrates an exemplary current versus time trace of potentiostatic growth of δ-$MnO_2$ at +0.60V versus MSE in solutions containing 10 mM HMTA.
Figure 3C:
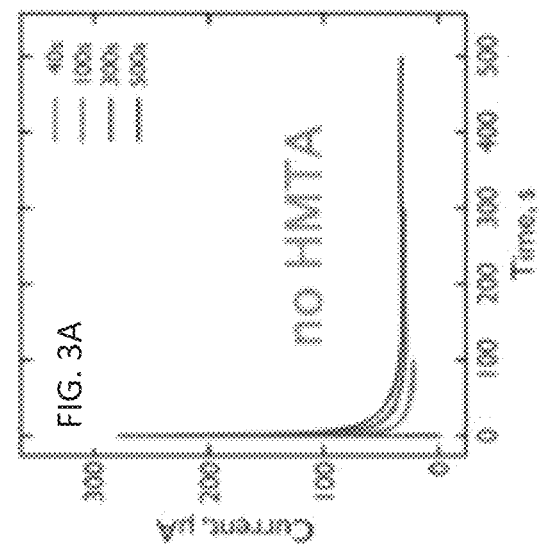
FIG. 3C illustrates exemplary gravimetric loading of $MnO_2$ per nanowire (0.90 cm length) based upon the measured coulometry obtained from deposition data like that shown in FIGS. 3A and 3B.
Figure 41:
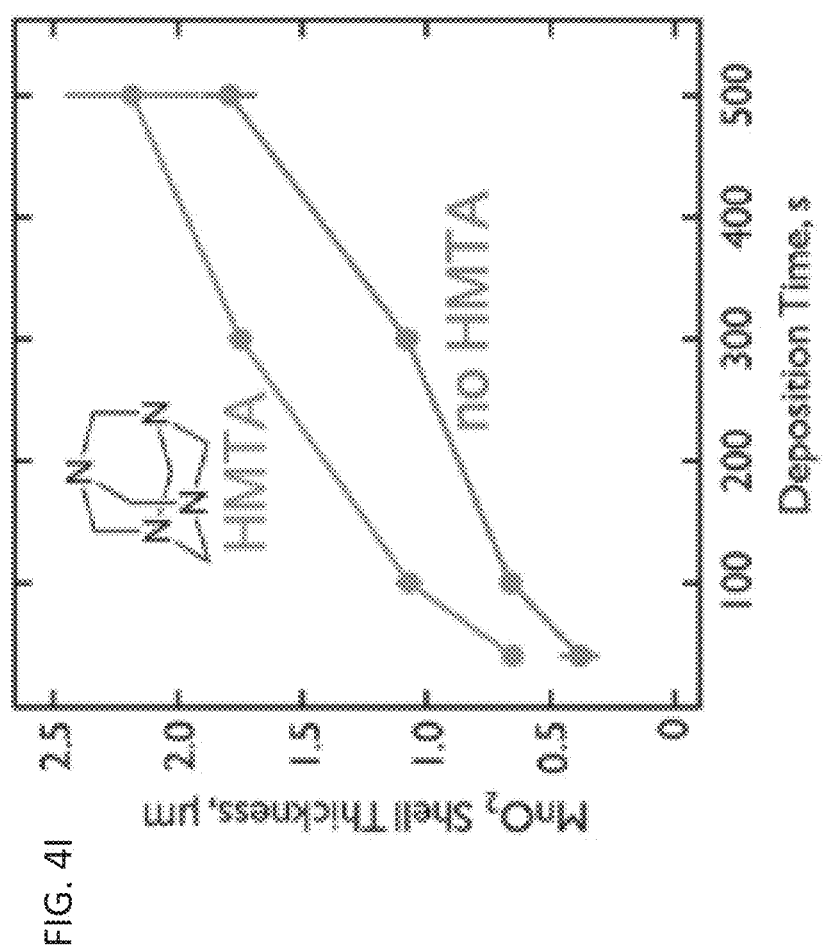

FIG. 3A illustrates an exemplary current versus time trace of potentiostatic growth of δ-MnO$_2$ at +0.60V versus MSE in solutions containing no-HMTA. FIG. 3B illustrates an exemplary current versus time trace of potentiostatic growth of δ-MnO$_2$ at +0.60V versus MSE in solutions containing 10 mM HMTA. FIG. 3C illustrates exemplary gravimetric loading of MnO$_2$ per nanowire (0.90 cm length) based upon the measured coulometry obtained from deposition data like that shown in FIGS. 3A and 3B.

The unbuffered plating solution employed for this reaction had a pH=7.2±0.2 and the pKa of HMTA is 4.9, so it is unprotonated at this pH. The presence of 10 mM HMTA in the plating solution had a subtle influence on the kinetics of MnO$_2$ deposition, increasing the reaction rate by 2-5% as determined from current versus time traces (FIGS. 3A, 3B), but the gravimetric loading of MnO$_2$ per nanowire (FIG. 3C), estimated from coulometry, 5 is the same within the reproducibility of the experiment. (Table 1).

Characterization of Au@δ-MnO$_2$ Core@Shell Nanowires.

FIG. 4A illustrates an exemplary SEM image of Au@MnO$_2$ core@shell nanowires where the MnO$_2$ shell was prepared in the absence of HTMA. FIG. 4B illustrates an exemplary SEM image of Au@δ-MnO$_2$ core@shell nanowires where the MnO$_2$ shell was prepared in the absence of HTMA. FIG. 4C illustrates an exemplary SEM image of δ-MnO$_2$ core@shell nanowires where the MnO$_2$ shell was prepared in the absence of HTMA. FIG. 4D illustrates an exemplary SEM image of Au@δ-MnO$_2$ core@shell nanowires where the MnO$_2$ shell was prepared in the absence of HTMA.

The δ-MnO$_2$ shells obtained by electrodeposition from HMTA-free plating solution onto gold nanowires has a morphology that consists of many concentric, wrinkled MnO$_2$ sheets wrapped one on top of another (FIGS. 4A-D). In SEM images, these sheets appear to have a thickness in the 2 nm range. In the presence of 10 mM HMTA, in contrast, a more open structure is observed for the shell, characterized by MnO$_2$ "petals" radiating from the gold nanowire core.

FIG. 4E illustrates an exemplary SEM image of Au@MnO$_2$ core@shell nanowires where the MnO$_2$ shell was prepared in the presence of HTMA. FIG. 4F illustrates an exemplary SEM image of Au@δ-MnO$_2$ core@shell nanowires where the MnO$_2$ shell was prepared in the presence of HTMA.

FIG. 4G illustrates an exemplary SEM image of Au@δ-MnO$_2$ core@shell nanowires where the MnO$_2$ shell was prepared in the presence of HTMA. FIG. 4H illustrates an exemplary SEM image of Au@δ-MnO$_2$ core@shell nanowires where the MnO$_2$ shell was prepared in the presence of HTMA. FIG. 4I illustrates an exemplary plot of thickness of the MnO$_2$ outer shell envelope as a function of $t_{dep}$, based on the width of the Au@δ-MnO$_2$ nanowires in plan-view SEM images like those shown in FIGS. 4A-4H.

The apparent thickness of each MnO$_2$ petal, however, is much thicker in the 10-30 nm range depending upon the deposition duration (FIGS. 4E-4H). The "envelope" of the MnO$_2$ shell, plotted in FIG. 4I, is also larger by 20-30% in spite of the fact that the coulombic loading of MnO$_2$ per nanowire was approximately the same (FIG. 3C).

This suggests that the porosity of the $MnO_2$ shell obtained in the presence of HMTA is greater than that which is obtained in its absence.

FIG. 5A illustrates exemplary characterization of Au@δ-$MnO_2$ nanowires. FIG. 5B illustrates XPS spectra of δ-$MnO_2$ films show high resolution scans in the Mn 3 s region. FIG. 5C illustrates XPS spectra of δ-$MnO_2$ films show high resolution scans in the N 1 s region. FIG. 5D illustrates exemplary characterization of Au@δ-$MnO_2$ nanowires.

Electron dispersive x-ray analysis (EDX) elemental maps of single δ-$MnO_2$ nanowires (FIG. 5A) show the presence of the central gold nanowire, and a manganese signal that spans the width of the δ-$MnO_2$ shell seen in the SEM image (FIG. 5A, far left). Nitrogen is not detected for Au@δ-$MnO_2$ nanowires prepared in HMTA-free solutions, but is seen for those prepared in 10 mM HMTA solutions (FIG. 5A, far right), with the nitrogen signal again spanning the width of the δ-$MnO_2$ shell seen in the SEM image. Based upon EDX survey spectra, nitrogen accounts for 5.4 (±0.40) at % in these samples. XPS data were acquired for δ-$MnO_2$ films, prepared on platinum electrodes using the same deposition potential (+0.60 V vs. MSE) employed for nanowire growth, and a 300 s deposition duration (FIGS. 5C-5D). High resolution scans in the Mn 3 s region (FIG. 5B) show chemical shifts that are identical for δ-$MnO_2$ films prepared in the presence and absence of HMTA and characteristic of $MnO_2$ prepared at +0.60 V vs. MSE.7 For δ-$MnO_2$ films prepared from HMTA-free solutions, surface nitrogen is not detected in the N is region (FIG. 5C), but it is seen in those δ-$MnO_2$ films prepared from HMTA-containing solutions at a surface concentration of 5.9 (±0.8) at %. Two distinct chemical shifts are observed for N 1 s at 399.0 eV and 400.5 eV (FIG. 5C). The 399.0 eV peak is characteristic of the $sp^3$ nitrogens in HMTA. A positive shift from this value might be expected upon protonation, but this is unlikely to be the case with HMTA because of the low $pK_a$ of its nitrogens (4.933). However, the incorporation of poly(aniline) into $MnO_2$ has been associated with the observation of N is binding energies in this range, possibly influenced by coordination to Mn centers. Based upon these observations, the two peaks seen in the N is spectra can possibly be assigned to HMTA nitrogens that are perturbed by coordination to Mn centers (400.5 eV), and those that are not coordinated (399.0 eV).

For nanowires and films obtained with and without HMTA, grazing incidence x-ray pow-der diffraction (GIXRD) patterns for arrays of Au@δ-$MnO_2$ nanowires show weaker reflection amplitudes than patterns acquired for films, but these patterns are otherwise very similar (FIG. 5D). Films and nanowires prepared in the presence of HMTA show new reflections at 9.6° and 18.5° that we assign to first and second order diffraction from domains of δ-$MnO_2$ having an expanded interlayer spacing of ≈9.4 Å (FIG. 5D). This is attributed to the inclusion of HMTA in the $MnO_2$ during growth. Weaker reflections at 12.2° and 24.5°, characteristic of δ-$MnO_2$ (JCPDS 43-1456), are still observed for these samples, but these patterns are consistent with expansion of the interlayer spacing of δ-$MnO_2$ by≈30% in the presence of HMTA.

FIG. 6A illustrates Cyclic voltammetry of no-HMTA Au/$MnO_2$ core:shell nanowire arrays. FIG. 6B illustrates Cyclic voltammetry of HMTA Au/$MnO_2$ core:shell nanowire arrays. FIG. 6C illustrates Cyclic voltammetry of no-HMTA Au/$MnO_2$ core:shell nanowire arrays.

The morphological, structural, and chemical changes induced in the δ-$MnO_2$ by HMTA, seen in the data of FIGS. 6A-D, exert a strong influence on its electrochemistry particularly for very thick shells and high potential scan rates. For the thinnest shells studied herein ($t_{dep}$=40 s) evaluated at the slowest scan rates (2 mV/s), $C_{sp}$ is 10% higher, on average, for HMTA versus no-HMTA samples (FIGS. 6A-6B, 6E). This is a modest difference that is inside of the present sample-to-sample error bars. The conclusion is that virtually the same number of Mn centers within these $MnO_2$ shells are electrochemically accessible and participating in Faradic charge storage, thereby contributing to $C_{sp}$. It is important to understand that the $C_{sp}$=90-110 F/g measured for these samples, with a shell thickness of 400-600 nm (FIG. 4I), is well below the theoretical value of 1110 F/g. $C_{sp}$ values in this range are readily measured for arrays of Au@δ-$MnO_2$ nanowires with much thinner shells in the 60-70 nm range. But as the scan rate is increased to 100 mV/s, even $t_{dep}$=40 s nanowires show a clear disparity in $C_{sp}$, as seen by comparing the CVs shown in FIGS. 6A-6B.

FIG. 6D illustrates Cyclic voltammetry of HMTA Au/$MnO_2$ core:shell nanowire arrays. FIG. 6E illustrates $C_{sp}$ versus scan rate for no-HMTA Au/$MnO_2$ core:shell nanowire arrays. FIG. 6F illustrates $C_{sp}$ versus scan rate for HMTA Au/$MnO_2$ core:shell nanowire arrays.

For the thickest shells ($t_{dep}$=500 s) at the highest scan rate (100 mV/s), the disparity between HMTA and no-HMTA samples is pronounced with $C_{sp}$ 15× higher, on average, for HMTA versus no-HMTA samples (FIGS. 6C, 6D, 6E).

Figure 7:
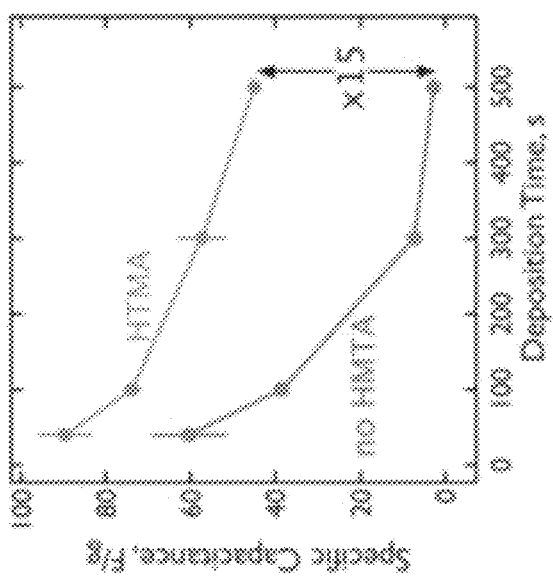
FIG. 7 illustrates a comparison of $C_{sp}$ at 100 mV/s for HMTA and no-HMTA Au@δ-MnO$_2$ nanowire arrays.

FIG. 7 illustrates a comparison of $C_{sp}$ at 100 mV/s for HMTA and no-HMTA Au@δ-$MnO_2$ nanowire arrays. The ability of δ-$MnO_2$ prepared in the presence of HMTA to store and deliver charge rapidly is significantly improved across all shell thicknesses examined here (FIG. 7).

The increase in XRD (001) layer spacing induced by the electrodeposition of δ-$MnO_2$ in the presence of HMTA (FIG. 5D) provides one rationale for the phenomena observed in FIGS. 6A-6E and 7. Accelerated Li transport between these expanded layers may be occurring. A second possible contributor to the improved rate behavior could be the electronic conductance of the δ-$MnO_2$. If the resistance of δ-$MnO_2$ shells prepared in HMTA was reduced, then the ohmic drop (IR) imposed by this shell at high scan rates would also be reduced, improving electrical communication across the radius of thick δ-$MnO_2$ shells. The conductance of "solid" δ-$MnO_2$ nanowires—that is, $MnO_2$ nanowires that contain no central gold nanowire—was measured in order to assess whether a significant difference in the electrical conductance was induced by the HMTA.

FIG. 8A illustrates an SEM image of six $MnO_2$ nanowires on glass. FIG. 8B illustrates higher magnification (compared to FIG. 8A) of SEM images of no-HMTA $MnO_2$ nanowires deposited for 500 s. Arrays of solid δ-$MnO_2$ nanowires were fabricated using LPNE as previously described (FIG. 8A).

FIG. 8C illustrates higher magnification (compared to FIG. 8A) of SEM images of HMTA $MnO_2$ nanowires deposited for 500 s. The morphology of HMTA and no-HMTA nanowires (FIGS. 8B-8C) mimics that seen for Au@δ-$MnO_2$ nanowires (FIGS. 4A-4H), but in contrast to Au@δ-$MnO_2$ nanowires, the lateral dimensions of the solid nanowires are controlled by the LPNE process because these nanowires are formed by electrodeposition entirely within the confines of a horizontal trench.

FIG. 8D illustrates current versus voltage for a no-HMTA nanowire array. FIG. 8E illustrates current versus voltage for a no-HMTA nanowire array. FIG. 8F illustrates current versus voltage for a HMTA nanowire array at the same current sensitivity shown in FIG. 8D.

The conductance of solid δ-MnO$_2$ nanowires was measured in laboratory air by recording current versus potential (I-V) traces for an array of 200 nanowires across a 10 μm gap between two evaporated gold electrodes (FIGS. 8D-F). These I-V traces were ohmic and clearly demonstrated a higher conductance for δ-MnO$_2$ prepared in the presence of HMTA relative to that in its absence, across all deposition times. This is immediately obvious from I-V traces recorded at the same current sensitivity for HMTA and no-HMTA arrays (FIGS. 8D, 8F), which show much higher currents for the HMTA nanowires.

FIG. 8G illustrates electrical conductance versus electrodeposition time for four deposition times for HMTA MnO$_2$ nanowires and no-HMTA MnO$_2$ nanowires. HMTA increased the conductance of δ-MnO$_2$ nanowires by approximately one order of magnitude across all deposition times (FIG. 8G). This factor is likely to contribute to the retention of $C_{sp}$ by Au@Au@δ-MnO$_2$ nanowires, particularly those with thick shells.

FIG. 9A illustrates a schematic diagram of an exemplary sandwich capacitor architecture. FIG. 9B illustrates a schematic diagram of a side view of an exemplary sandwich capacitor architecture. The improved performance of HMTA Au@δ-MnO$_2$ means little if its cycle stability is degraded. Recently, the inventors have demonstrated that no-HMTA Au@δ-MnO$_2$ nanowires cycled in a PMMA gel electrolyte, containing 1.0 M LiClO$_4$ in propylene carbonate, retain their specific capacity for 100,000 cycles or more. This extraordinary level of cycle stability represents a new standard for nanowires. "Sandwich" capacitors were fabricated from two planar layers of Au@δ-MnO$_2$ nanowires ($t_{dep}$=300 s), each layer containing 4000 nanowires (FIGS. 9A-B). In these devices, the two nanowire arrays are separated by 5 μm of the PMMA gel electrolyte. Capacitors are hermetically sealed in a dry box and cycled in laboratory air. $C_{sp}$ retention by Au@δ-MnO$_2$ nanowires was monitored for 50,000 cycles at 200 mV/s.

FIG. 9C illustrates Cyclic voltammograms as a function of scan rate for no-HMTA capacitors prepared using $t_{dep}$=300 s. FIG. 9D illustrates Cyclic voltammograms as a function of scan rate for HMTA capacitors prepared using $t_{dep}$=300 s. FIG. 9E illustrates $C_{sp}$ versus scan rate for both capacitors of FIGS. 9C and 9D.

FIG. 9F illustrates $C_{sp}$ (left axis) and coulombic efficiency (right axis), measured at 200 mV/s, as a function of number of scans.

Figure 10A:
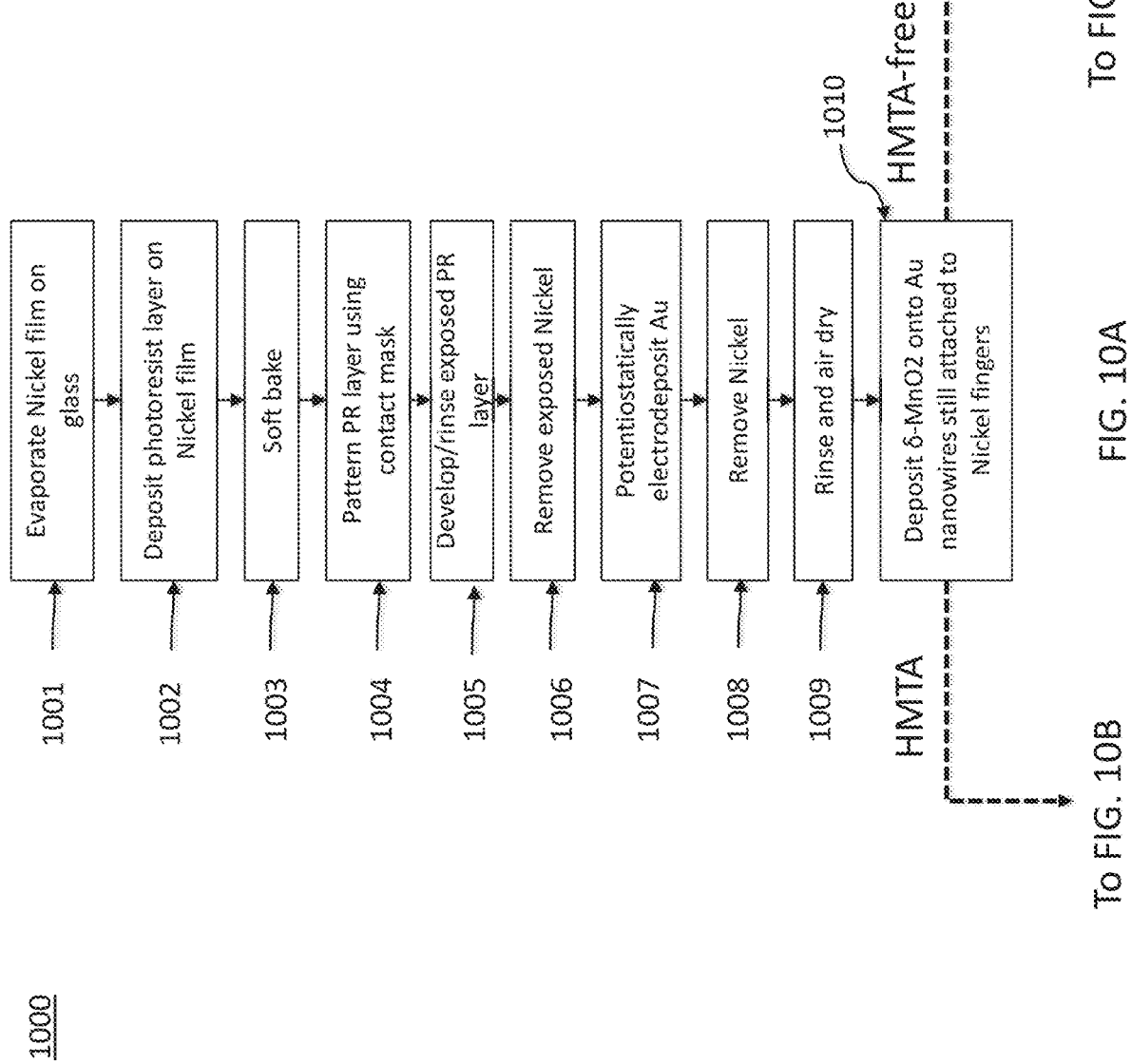
Figure 10B:
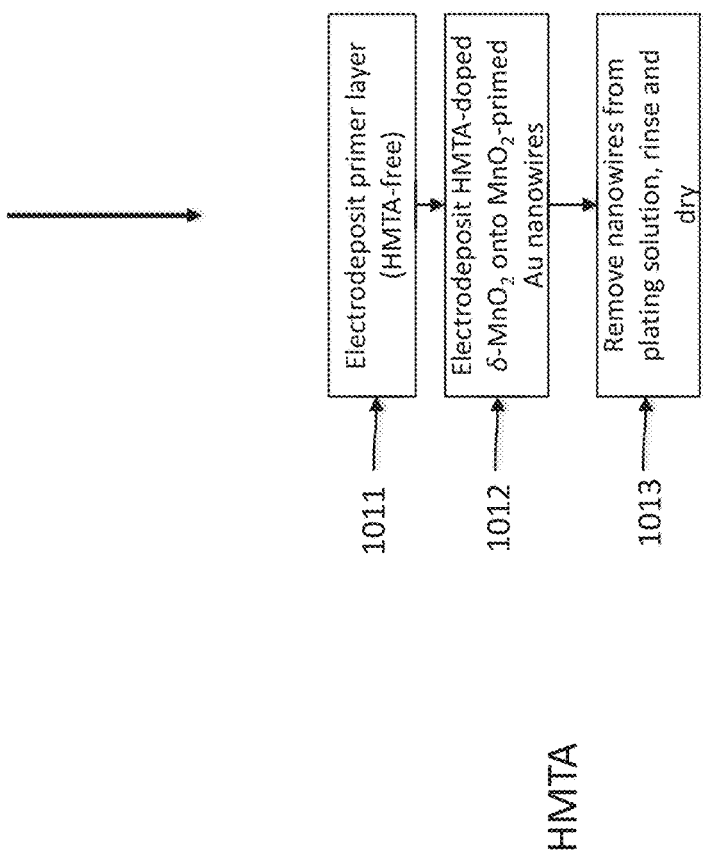

FIGS. 10A-C illustrate an exemplary fabrication process flow for use with embodiments of the present disclosure.

According to embodiments, a method 1000 for preparing planar arrays of gold@δ-MnO$_2$, core@shell nanowires comprises evaporating Ni film onto a glass substrate 1001. In embodiments, the glass substrate comprises soda lime glass.

In embodiments, the method 1000 continues with depositing a photoresist layer onto the Ni film 1002. In embodiments, the photoresist layer is a positive photoresist layer. In embodiments, the positive photoresist layer is deposited by spin coating.

In embodiments, the method 1000 continues with soft baking the substrate having the Ni film and photoresist layer 1003. In embodiments, the substrate is soft baked for 30 mins at 90° C.

In embodiments, the method 1000 continues with patterning the photoresist layer by applying a contact mask to the photoresist layer 1004. In embodiments, the photoresist layer is patterned using a 36 nm UV light source combined with a shutter and photolithographic alignment fixture.

In embodiments, the method 1000 continues with developing and rinsing the photoresist layer 1005. In embodiments, the photoresist layer is developed for 20 s. In embodiments, the photoresist layer is rinsed using Millipore water.

In embodiments, the method 1000 continues with etching to remove any exposed Ni from a top surface 1006. In embodiments, the exposed Ni is removed by etching for 6 min in nitric acid.

In embodiments, the method 1000 continues with potentiostatically electrodepositing Au onto the top surface 1007. In embodiments, the Au is electrodeposited using a Gamry Series G 300 potentiostat at −0.9 V versus saturated calomel electrode (SCE) using a one-compartment, three-electrode electrochemical cell with a Pt foil counter electrode.

In embodiments, the method 1000 continues with rinsing the top surface with acetone to remove remaining photoresist and reveal a nanowire array 1008.

In embodiments, the method 1000 continues with removing any remaining Ni from the nanowire array 1009. In embodiments, any remaining Ni is removed by immersion in nitric acid.

In embodiments, the method 1000 continues with electrodepositing δ-MnO$_2$ onto the nanowire wire array 1010 to produce the planar array of gold@δ-MnO$_2$, core@shell nanowires. In embodiments, depositing δ-MnO$_2$ onto the nanowire wire array comprises electrodepositing an HMTA-free primer layer 1011 onto the nanowire array to create MnO$_2$ primed gold nanowires, and electrodepositing HMTA-doped δ-MnO$_2$ onto the MnO$_2$ primed gold nanowires 1013.

In certain embodiments, Au/MnO$_2$ core:shell nanowires containing HMTA are prepared using a two-step procedure in which a thin HMTA-free "primer" layer is first electrodeposited as described above, using a $t_{dep}$=10 s. Then, HMTA-doped δ-MnO$_2$ is electrodeposited onto MnO$_2$-primed gold nanowires from a solution containing 10 mM HMTA in addition to 2 mM Mn(ClO$_4$)$_2$ and 50 mM LiClO$_4$. A $t_{dep}$ ranging from 30 s to 490 s results in the unique MnO$_2$ morphology described herein.

In embodiments, HMTA-free Au/MnO$_2$ nanowires are prepared using an aqueous solution of 2 mM Mn(ClO$_4$)$_2$ and 50 mM LiClO$_4$ by potentiostatic oxidation at +0.60 V vs. MSE. Deposition (1014) times ranging from 40 s to 500 s produced MnO$_2$ shells between 400 nm and 2.2 μm in thickness.

In embodiments, the completed nanowire arrays are removed from the plating solution, rinsed and dried (1013, 1015).

The present embodiments include the addition of the amine, HMTA, to the plating solution used to prepare the MnO$_2$ layer for Au@δ-MnO$_2$ core@shell nanowires. HMTA changes the morphology of the MnO$_2$, increases the (001) interlayer spacing by ≈30%, and increases its electrical conductance by an order of magnitude. The net result are Au@δ-MnO$_2$ nanowires that better retain $C_{sp}$ at high charge/discharge rates, and/or at high MnO$_2$ mass loadings. This is a large effect: $C_{sp}$ for the thickest δ-MnO$_2$ shells, with $t_{dep}$=500 s, were a factor of 15 times higher at 100 mV/s when HMTA was present in the plating solution. While the rate performance of Au@δ-MnO$_2$ nanowires is certainly improved by HMTA, a considerable loss of $C_{sp}$—close to 50%—is still seen (FIG. 7) for HMTA nanowires with the thickest MnO$_2$ shells (2.2 μm) relative to nanowires with the thinnest shells were examined (600 nm). This means that many Mn centers in the thickest MnO$_2$ shells are still not participating in charge storage on the time scale of these experiments.

TABLE 1

Summary of Metrics for Au@δ-MnO$_2$ Prepared in HMTA-Containing and HMTA-Free Plating Solutions

| δ-MnO$_2$ | tdep$^a$ (s) | Thickness$^b$ (nm) | Gravimetric Loading$^c$ (ng/nanowire) | $C_{sp}{}^d$ (F/g) | $C_{sp.HMTA}/C_{sp.no\text{-}HMTA}$ |
|---|---|---|---|---|---|
| No-HMTA | 40 | 380 ± 8 | 1.2 ± 0.3 | 60 ± 9 | |
| | 100 | 660 ± 20 | 4.3 ± 2 | 39 ± 1 | |
| | 300 | 1080 ± 50 | 8.9 ± 1 | 7 ± 2 | |
| | 500 | 1800 ± 110 | 11.8 ± 0.5 | 3 ± 2 | |
| HMTA | 40 | 650 ± 20 | 3.4 ± 3 | 90 ± 6 | 1.5 |
| | 100 | 1070 ± 50 | 4.6 ± 3 | 74 ± 2 | 1.9 |
| | 300 | 1700 ± 50 | 10.0 ± 1 | 57 ± 6 | 8.1 |
| | 500 | 2200 ± 300 | 12 ± 0.4 | 45 ± 1 | 5 |

$^a$The duration of the potentiostatic electrodeposition of MnO$_2$.
$^b$MnO$_2$ shell thickness measured using SEM.
$^c$Gravimetric loading is estimated from coulometry of the MnO$_2$ deposition. Loading pertains to nanowires 0.90 cm in length.

All features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. Express recitation of every possible combination and substitution is overly burdensome, especially given that the permissibility of each and every such combination and substitution will be readily recognized by those of ordinary skill in the art upon reading this description.

In many instances entities are described herein as being coupled to other entities. It should be understood that the terms "coupled" and "connected" (or any of their forms are used interchangeably herein and, in both cases, are generic to the direct coupling of two entities (without any non-negligible (e.g., parasitic intervening entities) and the indirect coupling of two entities (with one or more non-negligible intervening entities)). Where entities are shown as being directly coupled together, or described as coupled together without description of any intervening entity, it should be understood that those entities can be indirectly coupled together as well unless the context clearly dictates otherwise.

While the embodiments are susceptible to various modifications and alternative forms, specific examples thereof have been shown in the drawings and are herein described in detail. It should be understood, however, that these embodiments are not to be limited to the particular form disclosed, but to the contrary, these embodiments are to cover all modifications, equivalents, and alternatives falling within the spirit of the disclosure. Furthermore, any features, functions, steps, or elements of the embodiments may be recited in or added to the claims, as well as negative limitations that define the inventive scope of the claims by features, functions, steps, or elements that are not within that scope.

What is claimed:

1. A method for preparing arrays of δ-MnO$_2$ based core@shell nanowires, the method comprising:
    a step of electrodepositing a core metal to form an array of nanowire cores; and
    a step of electrodepositing HMTA-doped δ-MnO$_2$ onto the array of nanowire cores forming an array of core metal@shell δ-MnO$_2$, core@shell nanowires.

2. The method of claim 1, wherein the core metal comprises Au.

3. The method of claim 1, wherein the array of nanowire cores is formed on a glass substrate.

4. The method of claim 1, further comprising a step of the step of depositing a photoresist layer onto a substrate;
    patterning the photoresist layer; and
    wherein the step of electrodepositing a core metal includes electrodepositing the core metal on the patterned photoresist layer forming the array of nanowire cores on the patterned photoresist layer.

5. The method of claim 1, wherein the step of electrodepositing HMTA-doped δ-MnO$_2$ comprises:
    a step of electrodepositing an HMTA-free primer layer onto the array of nanowire cores to create an array of MnO$_2$ primed nanowire cores; and
    a step of electrodepositing HMTA-doped δ-MnO$_2$ onto the array of MnO$_2$ primed nanowires cores forming the array of δ-MnO$_2$ based core@shell nanowires.

6. A method for preparing arrays of δ-MnO$_2$ based nanowires, the method comprising:
    a step of depositing a photoresist layer onto a substrate;
    a step of patterning the photoresist layer; and
    a step of electrodepositing HMTA-doped δ-MnO$_2$ onto the patterned photoresist layer to produce an array of δ-MnO$_2$ based nanowires.

7. The method of claim 6, wherein the substrate comprises soda lime glass.

8. The method of claim 6, wherein the photoresist layer is deposited by spin coating.

9. The method of claim 6, wherein the photoresist layer is patterned using a 36 nm UV light source combined with a shutter and photolithographic alignment fixture.

10. The method of claim 9, wherein the photoresist layer is developed for 20 s.

11. The method of claim 10, wherein the photoresist layer is rinsed using water.

12. The method of claim 6, wherein a step of electrodepositing HMTA-doped δ-MnO$_2$ onto the patterned photoresist layer comprises:
    a step of electrodepositing an HMTA-free primer layer onto the patterned photoresist layer to create a MnO$_2$ primed patterned photoresist; and
    a step of electrodepositing HMTA-doped δ-MnO$_2$ onto the MnO$_2$ primed patterned photoresist forming the array of δ-MnO$_2$ based nanowires.

13. An energy storage device comprising:
    first and second contacts; and
    an array of nanowires extending between the first and second contacts, wherein individual nanowires of the array of nanowires include HMTA-doped δ-MnO$_2$.

14. The energy storage device of claim 13, wherein the HMTA-doped δ-MnO$_2$ is a coating characterized by petals with a thickness of 6 nm to 9 nm.

15. The energy storage device of claim 13, wherein the HMTA-doped δ-$MnO_2$ includes interlayer spacing that is expanded by ~30% compared to non-HMTA-doped δ-$MnO_2$.

16. The energy storage device of claim 13, wherein $C_{sp}$ for the HMTA-doped δ-$MnO_2$ with $t_{dep}$=500 s is at least 15× higher at 200 mV/s than non-HMTA-doped δ-$MnO_2$.

\* \* \* \* \*